United States Patent [19]

Kok et al.

[11] Patent Number: 5,073,480

[45] Date of Patent: Dec. 17, 1991

[54] QUICK ACTING HARDENER FOR PHOTOGRAPHIC GELATIN LAYERS

[75] Inventors: Piet Kok, Gent; Erik V. Van der Eycken, Berchem, both of Belgium

[73] Assignee: AGFA-Gevaert, N.V., Mortsel, Belgium

[21] Appl. No.: 551,030

[22] Filed: Jul. 11, 1990

[30] Foreign Application Priority Data

Jul. 14, 1989 [EP] European Pat. Off. ........ 89201865.6

[51] Int. Cl.[5] ............ H03C 1/30

[52] U.S. Cl. ............ 430/623; 430/621; 530/354; 530/409; 106/125

[58] Field of Search ............ 430/621, 623; 530/354, 530/409; 106/125

[56] References Cited

U.S. PATENT DOCUMENTS 3,125,449 3/1964 Jeffreys ............ 96/111
4,376,818 3/1983 Ohashi et al. ............ 430/623
4,618,573 10/1986 Okamura et al. ............ 430/558

FOREIGN PATENT DOCUMENTS 58-113929 7/1983 Japan .

*Primary Examiner*—Charles L. Bowers, Jr.
*Assistant Examiner*—Janis L. Dote
*Attorney, Agent, or Firm*—Breiner & Breiner

[57] ABSTRACT

Process for hardening proteinaceous materials by means of a quick acting hardener corresponding to the following formula

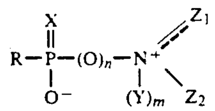

wherein:

$Z_1$ and $Z_2$ each independently represent substituted or unsubstituted alkyl, substituted or unsubstituted cycloalkyl, substituted or unsubstituted aryl, or $Z_1$ represents substituted or unsubstituted alkylidene or $Z_1$ and $Z_2$ together represent the atomic grouping required to complete a 5- or 6-membered substituted or unsubstituted heterocyclic ring, including an aromatic heterocyclic ring and including such a ring with a ring fused-on, which atomic grouping may contain other hetero atoms in addition to the nitrogen atom;

Y represents substituted or unsubstituted alkyl, substituted or unsubstituted cycloalkyl, substituted or unsubstituted aryl;

X represents O or S;

R represents substituted or unsubstituted alkyl, substituted or unsubstituted cycloalkyl, substituted or unsubstituted aryl, substituted or unsubstituted alkyloxy, substituted or unsubstituted aryloxy, substituted or unsubstituted alkylthio, substituted or unsubstituted arylthio, substituted or unsubstituted amino or $O^-$;

n represents 0 or 1, and m represents 0 or 1, m being 0 if the nitrogen to which Y is attached is involved in a double bond.

11 Claims, No Drawings

QUICK ACTING HARDENER FOR PHOTOGRAPHIC GELATIN LAYERS

DESCRIPTION

The present invention relates to the hardening of proteinaceous materials, in particular gelatin, used as binders in photographic layers.

Various agents have been employed for hardening gelatin or other proteinaceous materials that are used as binder in photographic layers. They include, for example, metal salts as chromium, aluminum or zirconium salts; aldehydes and halogenated aldehyde compounds, in particular formaldehyde, dialdehydes and mucochloric acid; 1,2- and 1,4-diketones such as cyclohexane-1,2-dione and quinones as well as chlorides of dibasic organic acids; anhydrides of tetracarboxylic acids; compounds which contain several reactive vinyl groups, such as vinyl sulfones; acrylamides; compounds containing at least two heterocyclic three-membered rings which can easily be split off, such as ethylene oxide and ethylene imine; polyfunctional methane sulfonic acid esters and bis-alpha-chloroacyl amido compounds.

It is particularly important for hardening photographic layers that hardening should reach its maximum as soon as possible after drying begins, so that prolonged storage times are not necessary.

A group of quick acting hardeners has been described in U.S. Pat. Nos. 3,880,665 and 4,063,952. These hardeners are carbamoylammonium compounds in which the quaternary nitrogen atom is a member of a 5 or 6-membered heterocyclic ring.

It is an object of the present invention to provide novel quick acting hardeners for proteinaceous materials, and in particular for gelatin layers, which are used for photographic purposes.

Other objects will become apparent from the description hereinafter.

According to the present invention a process for hardening proteinaceous materials is provided characterized by the use of a quick acting hardener corresponding to the following formula

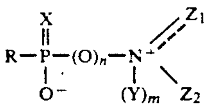

wherein:

$Z_1$ and $Z_2$ each independently represent substituted or unsubstituted alkyl, substituted or unsubstituted cycloalkyl, substituted or unsubstituted aryl, or $Z_1$ represents substituted or unsubstituted alkylidene or $Z_1$ and $Z_2$ together represent the atomic grouping required to complete a 5- or 6-membered substituted or unsubstituted heterocyclic ring, including an aromatic heterocyclic ring and including such a ring with a ring fused-on, which atomic grouping may contain other hetero atoms in addition to the nitrogen atom;

Y represents substituted or unsubstituted alkyl, substituted or unsubstituted cycloalkyl, substituted or unsubstituted aryl;

X represents O or S;

R represents substituted or unsubstituted alkyl, substituted or unsubstituted cycloalkyl, substituted or unsubstituted aryl, substituted or unsubstituted alkyloxy, substituted or unsubstituted aryloxy, substituted or unsubstituted alkylthio, substituted or unsubstituted arylthio, substituted or unsubstituted amino or $O^-$;

n represents 0 or 1, and m represents 0 or 1, m being 0 if the nitrogen to which Y is attached is involved in a double bond.

Preferably X represents O, n represents 0 and $Z_1$ and $Z_2$ together represent the atomic grouping required to complete an imidazole ring or a diazole ring or a pyridine ring.

According to a preferred embodiment of the present invention the hardener corresponds to the following formula

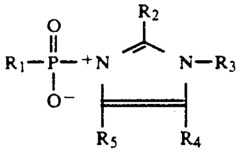

wherein:

$R_1$ represents subtituted or unsubstituted alkyl, substituted or unsubstituted cycloalkyl, substituted or unsubstituted aryl, substituted or unsubstituted alkyloxy, substituted or unsubstituted aryloxy, substituted or unsubstituted alkylthio, substituted or unsubstituted arylhio, substituted or unsubstituted amino or $O^-$;

$R_2$, $R_3$, $R_4$ and $R_5$ each independently represent hydrogen, substituted or unsubstituted alkyl, substituted or unsubstituted cycloalkyl, substituted or unsubstituted aryl, substituted or unsubstituted alkyloxy, substituted or unsubstituted aryloxy, substituted or unsubstituted alkylthio, substituted or unsubstituted arylthio, or $R_2$ and $R_3$ together represent the necessary atoms to complete a substituted or unsubstituted heterocyclic ring, or $R_3$ and $R_4$ together represent the necessary atoms to complete a substituted or unsubstituted heterocyclic ring, or $R_4$ and $R_5$ together represent the necessary atoms to complete a substituted or unsubstituted ring fused-on the imidazole ring.

The hardener of the present invention can be incorporated via substituents on $Z_1$ and/or $Z_2$ in the side-chain of a polymer, that preferably also contains comonomers with a solubilizing group.

Examples of suitable hardeners according to the present invention are listed below in table 1.

TABLE 1

| | |
|---|---|
| 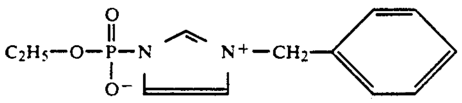 | C1 |
| 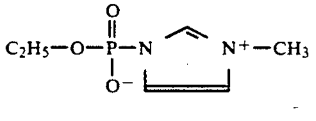 | C2 |
| 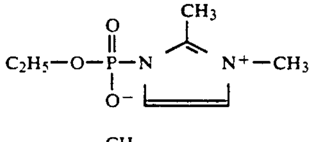 | C3 |
| 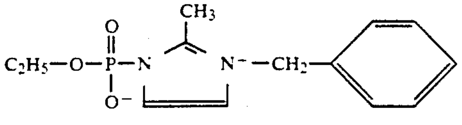 | C4 |

TABLE 1-continued

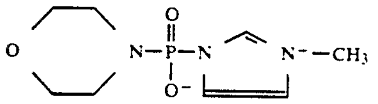
C5

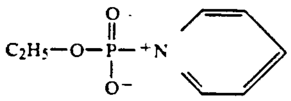
C6

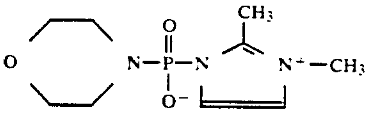
C7

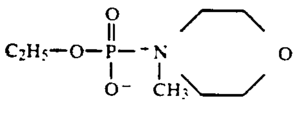
C8

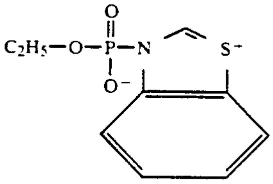
C9

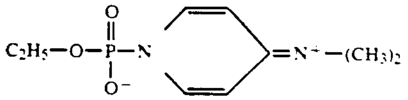
C10

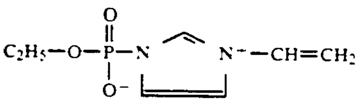
C11

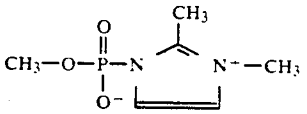
C12

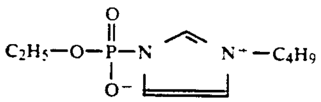
C13

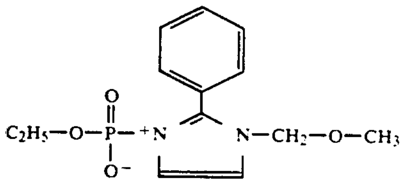
C14

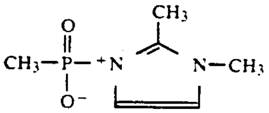
C15

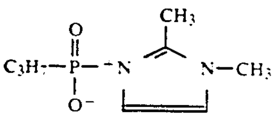
C16

TABLE 1-continued

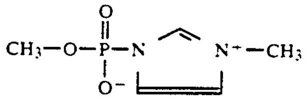
C17

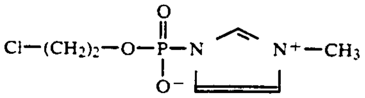
C18

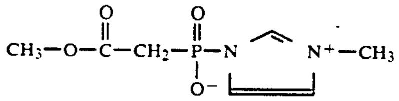
C19

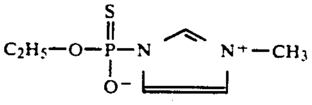
C20

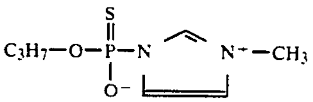
C21

The hardeners of the present invention are prepared along the lines described in FR 2437413. Hardeners wherein R represents $O^-$ are prepared along the lines described by D. Herschlag and W. P. Jencks in J.Am.-Chem.Soc., Vol. 112, 1990, pages 1942 to 1950.

The process according to the present invention has proved suitable for hardening photographic layers with a proteinaceous binder, in particular gelatin.

The term photographic layer is used in this context as a general term to denote any layer used in photographic materials, for example, light sensitive silver halide emulsion layers, protective layers, filter layers, antihalation layers, backing layers, nuclei containing layers, mordanting layers, image receiving layers or, in general, any photographic auxiliary layer.

Examples of photographic materials wherein the present hardener can be used are black-and-white films and papers, color negative films, color reversal films, color photographic papers, materials for dye diffusion transfer or silver salt diffusion transfer.

The light sensitive emulsion layers include those layer which are based on unsensitized emulsions, orthochromatic, panchromatic or infrared emulsions, X-ray emulsions and other spectrally sensitized emulsions, T-grain emulsions, core-shell type emulsions, etc.

The process according to the invention has proved particularly advantageous for hardening composite photographic layers used for color photographic processes, e.g., those which contain emulsion layers with color couplers or emulsion layers which are designed to be treated with solutions which contain color couplers.

Apart from gelatin, the layers may also contain water-soluble high polymer compounds, in particular polyvinyl alcohol, polyacrylic acid sodium and other copolymers which contain carboxyl groups, polyvinyl pyrrolidone, polyacrylamide or high molecular weight natural substances such as dextrans, dextrins, starch ether, alginic acid or alginic acid derivatives.

The concentrations at which the hardeners according to the present invention are used may vary within wide limits and depend mainly on the hardening compound used. Satisfactory results are obtained with quantities of 0.1 to 10% by weight and particularly 0.2 to 6% by weight, based on the dry weight of proteinaceous binder.

The present hardeners can be used in combination with other hardening agents commonly used in photography.

The hardeners used according to the invention may be added to the photographic layers which are to be hardened immediately before they are cast. This method of addition immediately before casting is necessary because the compounds react very rapidly with gelatine or any other proteinaceous binders commonly used in photography.

Another possible method if employing the hardeners of the present invention consists of first casting the unhardened casting solutions and then coating the resulting layers with an aqueous solution of the hardening compound containing a thickening agent such as polyacryl amide.

The hardening compound of the present invention can be used in combination with photographic components such as magenta coupling compounds of the pyrazoloazole type and the acylaminopyrazolon type, cyan coupling compounds of the 2-ureidophenol type and the 1,5-aminonaphthol type, yellow coupling compounds of the benzoylacetanilide type and the pivaloylacetanilide type, polymeric water-soluble and latex compounds with carboxylic groups, development inhibitor releasing and development accelerator releasing components.

The present hardening compounds can advantageously be used in combination with covering power increasing agents such as polydextran, with spacing agents containing carboxylic groups, with oilforming agents containing carboxylic groups.

Examples of photograhic components that can be used in combination with the present hardeners are given in EP 358071, EP 358073, EP 369235, DE 3833387, DE 3835077, DE 3838467, DE 3840619 that are incorporated herein by reference.

The invention will now be described in more detail in the following examples.

EXAMPLE 1

4.49% by weight, based on the weight of gelatine, of hardener C3 was added in the form of an aqueous solution to a photographic silver bromide gelatine emulsion which was ready for coating and contained, based on the quantity of gelatine, 50% by weight of cyan color couplers of the following formulae

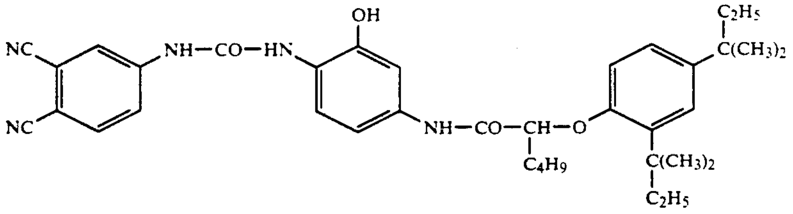

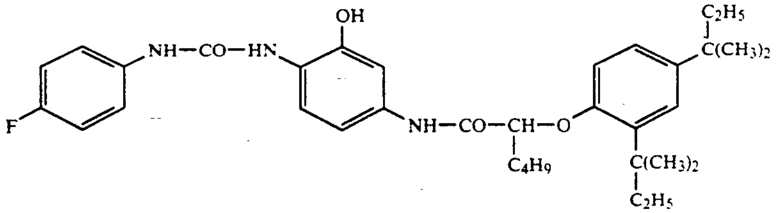

The mixture was stirred vigorously and immediately coated on a substrate and dried.

A comparative photographic element was prepared using 7% by weight of a carbamoyl pyridinium hardener (B1) corresponding to the following formula

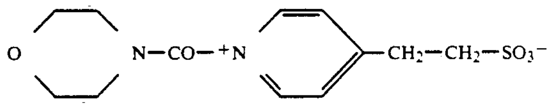

The hardening degree of the gelatin emulsion layer was measured by determination of the abrasion resistance of the wet layer. A metal tip of a specified size was passed over the wet layer and loaded with increasing weights. The abrasion resistance was indicated by the lowest weight at which the point left a visible scratch trace on the layer. A high abrasion resistance corresponds with a high hardening of the layer.

The abrasion resistance of the layer was measured after different storing conditions: stored at 57° C. and 34% relative humidity for 36 hours (storing condition 1), stored at 36° C. and 80% relative humidity for 7 days (storing condition 2). The following results were obtained.

TABLE 2

| hardener | storing condition 1 | storing condition 2 |
|---|---|---|
| C3 | 300 | 550 |
| B1 | 150 | 200 |

These results show that the present hardening compound C3 is more active than the comparative hardening compound B1 leading to favourable hardening results at severe storing conditions.

EXAMPLE 2

A cubic grain type silver iodo-bromide (1 mole % of iodide) emulsion having an average grain size of 0.3 μm, chemically sensitized with ammonium gold(III) thiocyanate and sodium thiosulfate and stabilized with 4-hydroxy-6-methyl-(1,3,3a,7)-tetraazaindene and 5-nitroindazole was coated onto a subbed polyethylene terephthalate support at a gelatin coverage of 2.7 g per sq. m. and a coverage of silver halide equivalent to 3.3 g of silver per sq. m.

The silver halide emulsion layer was coated with a protective layer containing gelatin at a coverage of 0.64 g per sq. m., hardened with compound C3 at a coverage of 1.106 mmol per sq. m. The hardening compound was added to the coating composition immediately prior to coating.

The degree of swelling of the gelatin layer was determined by indicating the water take-up in g per sq. m. after storing for 5 days at 35° C. and 80% relative humidity. The lower the water take-up, the higher the hardening. The results are shown in table 3.

A comparative photographic element was prepared using hardener B1 at a coverage of 1.16 mmol per sq. m. The degree of water take-up of this element is also shown in table 3.

TABLE 3

| hardener | coverage (mmol/m²) | water take-up (g/m²) |
|---|---|---|
| C3 | 1.106 | 11.3 |
| B1 | 1.16 | 18.5 |

These results show that hardening compound C3 of the present invention brings about a higher hardening degree than comparative hardening compound B1 at comparable coverage.

In addition the light sensitivity of the photographic element is increased in the case of C3.

EXAMPLE 3

Similar photographic elements as the ones described in example 2 above were prepared using same hardener C3 at different coverages as indicated in table 4 below.

Comparative photographic elements were prepared using the comparative hardener B1 at different coverages.

The degree of water take-up of these elements are listed in table 4 below.

TABLE 4

| hardener | coverage (mmol/m²) | water take-up (g/m²) |
|---|---|---|
| C3 | 0.369 | 17.6 |
| C3 | 0.737 | 12.4 |
| C3 | 1.106 | 11.3 |
| C3 | 2.211 | 6.8 |
| C3 | 4.422 | 4.7 |
| B1 | 0.6 | 13.5 |
| B1 | 0.9 | 12.3 |
| B1 | 1.4 | 10.7 |
| B1 | 2.1 | 8.0 |
| B1 | 3.2 | 7.3 |

These results show that in case of C3 the degree of hardening can be influenced substantially by varying the concentration of the hardener. This influence is not so strong in the case of B1.

EXAMPLE 4

A similar photographic element as the one described in example 2 above was prepared using the hardener C2 at a coverage of 1.108 mmol per sq. m.

The degree of water take-up of this element is listed in table 5 below.

TABLE 5

| hardener | coverage (mmol/m²) | water take-up (g/m²) |
|---|---|---|
| C2 | 1.108 | 9.0 |

EXAMPLE 5

The degree of swelling of the gelatin protective layer of a commercially available cinematographic material XT 320 (supplied by Agfa-Gevaert N.V., Mortsel, Belgium) hardened with compound B1 was determined by indicating the water take-up in g per sq. m. after storing for several days at 20° C. and 57% relative humidity.

Similar photographic elements were prepared with the difference that the hardener C3 was used instead of B1 in a molecular ratio equal to the ratio of B1 in XT 320 or in a 20% higher molecular ratio.

The results of the water take-up (in g/m²) after several days of storage are listed in table 6.

TABLE 6

| hardener | 1 day | 2 days | 5 days | 9 days | 44 days |
|---|---|---|---|---|---|
| B1 | 51.04 | 51.35 | 50 | 51.04 | 52.4 |
| C3 | 91.35 | 70.73 | 51.71 | 51.56 | 42.9 |
| C3 (+20%) | 76.98 | 60.52 | 50.94 | 45.52 | 38.8 |

In the case of C3 a higher degree of hardening is obtained although at a later stage.

In addition the light sensitivity of the orthochromatic layer is higher in the case of C3 and the graininess of the non-sensitized, orthochromatic and panchromatic layers is improved.

We claim:

1. Process for hardening proteinaceous materials by contacting the said materials with a quick acting hardener corresponding to the following formula;

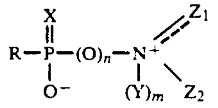

wherein:

$Z_1$ and $Z_2$ each independently represent substituted or unsubstituted alkyl, substituted or unsubstituted cycloalkyl, substituted or unsubstituted aryl, or $Z_1$ represents substituted or unsubstituted alkylidene or $Z_1$ and $Z_2$ together represent the atomic grouping required to complete a 5- or 6-membered substituted or unsubstituted heterocyclic ring, including an aromatic heterocyclic ring and including such a ring with a ring fused-on, which atomic grouping may contain other hetero atoms in addition to the nitrogen atom;

Y represents substituted or unsubstituted alkyl, substituted or unsubstituted cycloalkyl, substituted or unsubstituted aryl;

X represents O or S;

R represents substituted or unsubstituted alkyl, substituted or unsubstituted cycloalkyl, substituted or unsubstituted aryl, substituted or unsubstituted alkyloxy, substituted or unsubstituted aryloxy, substituted or unsubstituted alkylthio, substituted or unsubstituted arylthio, substituted or unsubstituted amino or $O^-$;

n represents 0 or 1, and m represents 0 or 1, m being 0 if the nitrogen to which Y is attached is involved in a double bond.

2. Process according to claim 1, wherein X represents O.

3. Process according to claim 1, wherein n represents

4. Process according to claim 1, wherein $Z_1$ and $Z_2$ together represent the atomic grouping necessary to complete an imidazole ring or a diazole ring or a pyridine ring.

5. Process according to claim 4, wherein the hardener corresponds to the following formula;

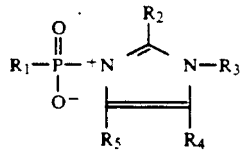

wherein:

$R_1$ represents substituted or unsubstituted alkyl, substituted or unsubstituted cycloalkyl, substituted or unsubstituted aryl, substituted or unsubstituted alkyloxy, substituted or unsubstituted aryloxy, substituted or unsubstituted alkylthio, substituted or unsubstituted arylthio, substituted or unsubstituted amino or $O^-$;

$R_2$, $R_3$, $R_4$ and $R_5$ each independently represent hydrogen, substituted or unsubstituted alkyl, substituted or unsubstituted cycloalkyl, substituted or unsubstituted aryl, substituted or unsubstituted alkyloxy, substituted or unsubstituted aryloxy, substituted or unsubstituted alkylthio, substituted or unsubstituted arylthio, or $R_2$ and $R_3$ together represent the necessary atoms to complete a substituted or unsubstituted heterocyclic ring, or $R_3$ and $R_4$ together represent the necessary atoms to complete a substituted or unsubstituted heterocyclic ring, or $R_4$ and $R_5$ together represent the necessary atoms to complete a substituted or unsubstituted ring fused-on the imidazole ring.

6. Process according to claim 5, wherein $R_1$ represents alkyloxy, $R_2$ and $R_3$ each represent alkyl and $R_4$ and $R_5$ each represent hydrogen.

7. Process according to claim 1, wherein the hardener is incorporated via $Z_1$ and/or $Z_2$ in the side-chain of a polymer.

8. Process according to claim 1, wherein the proteinaceous material is gelatin.

9. Process according to claim 1, wherein the proteinaceous material is a photographic silver halide emulsion layer, a photographic backing layer, a photographic protective layer, a photographic filter layer, a photographic antihalation layer, a nuclei containing layer, a mordanting layer, an image receiving layer or any other photographic auxiliary layer of a photographic silver halide element.

10. Process according to claim 9, wherein the photographic layer is comprised in a color silver halide photographic element.

11. Photographic material containing a support and one or more proteinaceous layers wherein at least one of said layers has been hardened according to the process of claim 1.

* * * * *